(12) United States Patent
Hawn

(10) Patent No.: US 10,674,645 B2
(45) Date of Patent: Jun. 2, 2020

(54) MODULAR EMF/RF SHIELDED ENCLOSURES

(71) Applicant: Jerry Hawn, Jacksonville, FL (US)

(72) Inventor: Jerry Hawn, Jacksonville, FL (US)

(73) Assignee: EVENT SECURE, INC., Jacksonville, FL (US)

( * ) Notice: Subject to any disclaimer, the term of this patent is extended or adjusted under 35 U.S.C. 154(b) by 0 days.

(21) Appl. No.: 16/517,991

(22) Filed: Jul. 22, 2019

(65) Prior Publication Data

US 2020/0029474 A1    Jan. 23, 2020

Related U.S. Application Data

(60) Provisional application No. 62/701,205, filed on Jul. 20, 2018.

(51) Int. Cl.
*H05K 9/00* (2006.01)

(52) U.S. Cl.
CPC .................. *H05K 9/0003* (2013.01)

(58) Field of Classification Search
CPC .................................................. H05K 9/0003
See application file for complete search history.

(56) References Cited

U.S. PATENT DOCUMENTS

| | | |
|---|---|---|
| 2,704,301 A | 3/1955 | Feketics |
| 2,838,592 A | 6/1958 | Feketics |
| 3,153,692 A | 10/1964 | Lindgren |
| 4,371,175 A | 1/1983 | Van Dyk, Jr. |
| 4,746,765 A | 5/1988 | Mallott |
| 4,777,565 A | 10/1988 | McIntosh |
| 4,794,206 A | 12/1988 | Weinstein |
| 4,806,703 A | 2/1989 | Sims |
| 4,831,210 A | 5/1989 | Larson et al. |
| 4,953,324 A | 9/1990 | Herrmann |
| 4,964,252 A | 10/1990 | Guliker |
| 5,147,694 A | 9/1992 | Clarke |
| 5,847,316 A | 12/1998 | Takada |
| 6,348,652 B1 * | 2/2002 | Carrozzi ............. H05K 9/0003 174/384 |
| 6,992,246 B2 | 1/2006 | Christou |
| 7,117,640 B2 | 10/2006 | Hurzeler |
| 7,246,681 B2 | 7/2007 | Christen |
| 7,501,588 B2 | 3/2009 | Noda et al. |
| 8,176,682 B2 | 5/2012 | Gaviglia |
| 8,530,756 B1 | 9/2013 | Winch |
| 8,642,900 B2 | 2/2014 | Nordling et al. |
| 8,925,251 B1 | 1/2015 | Rust |
| 9,029,714 B2 | 5/2015 | Winch et al. |

(Continued)

OTHER PUBLICATIONS

Thomas; International Search Report; PCT/US19/42786 re Modular EMF/RF Shielded Enclosures (Hawn); dated Oct. 18, 2019.

*Primary Examiner* — Hung V Ngo
(74) *Attorney, Agent, or Firm* — Thomas C. Saitta

(57) ABSTRACT

A modular EMF/RF shielded enclosure having interconnected walls, floor and ceiling panel members such that passage of EMF/RF form or into the enclosure is blocked or attenuated. Quick-connect, quick-release compressive connector members composed of electrically conductive material are used to join adjacent panel members, such that the connector members carry the common ground between adjacent panels and a continuous shielding envelope in the nature of a Faraday cage is formed.

13 Claims, 4 Drawing Sheets

(56) References Cited

U.S. PATENT DOCUMENTS

| | | |
|---|---|---|
| 9,605,928 B2 | 3/2017 | Oxford et al. |
| 9,828,798 B1 | 11/2017 | Lahita |
| 10,257,965 B1* | 4/2019 | Hansen .................. B32B 5/022 |
| 2007/0107350 A1* | 5/2007 | Surace ................. H05K 9/0003 |
| | | 52/461 |
| 2008/0233426 A1* | 9/2008 | Gaviglia ................. B23K 1/19 |
| | | 428/648 |
| 2013/0042556 A1 | 2/2013 | Armijo |
| 2014/0109495 A1 | 4/2014 | Segall |
| 2018/0027706 A1* | 1/2018 | Winch ................... E04F 15/00 |
| | | 174/382 |
| 2019/0029147 A1* | 1/2019 | Cordes ..................... G21F 3/04 |
| 2019/0124800 A1* | 4/2019 | Bodi ................... H05K 9/0003 |

* cited by examiner

MODULAR EMF/RF SHIELDED ENCLOSURES

BACKGROUND OF THE INVENTION

This application relates generally to the field of structures, rooms or enclosures (referred to hereinafter as "enclosures") constructed to block or attenuate passage of electromagnetic fields (EMF) and radio frequencies (RF), such that passage of EMF/RF into or out of the enclosure is precluded or severely reduced. More particularly, the application relates to such enclosures that are designed to be temporary, wherein the enclosures are constructed using modular panel members to enable relatively rapid assembly and disassembly.

Electromagnetic field and radio frequency shielding involves the creation of barriers to block the EMF/RF, the barriers being made of conductive or magnetic shielding materials. The shielding isolates electrical or electronic devices from their surroundings, such that external EMF/RF is prevented from entering the enclosure and internal EMF/RF is prevented from exiting the enclosure. Such enclosures are often required to isolate electronic devices from their surroundings, to preclude unwanted eavesdropping, for demonstration of new electronic devices, to preclude external transmissions, prevent corruption of data, etc.

A conductive EMF/RF shielded enclosure is often referred to as a Faraday cage. The degree or effectiveness of the shielding is determined by the choice of shielding material, such as metal sheeting, screens or mesh, fabric, ink or paint, the thickness, the size of the enclosure, the frequencies to be controlled, and the presence of apertures. The continuous conductive layer formed by the conductive material is grounded, also known as bonded, by an electrical conduit connected to a suitable ground.

A representative application for the modular EMF/RF shielded enclosures of the invention is the construction of temporary enclosures at trade shows, where a vendor or presenter desires or needs to create a controlled EMF/RF environment. In current practice, an enclosure is constructed utilizing standard construction methods to form a conductively interconnected structure having walls and a ceiling, and if necessary a floor. For example, wood boards and panels are nailed or screwed together to create three dimensional panels for a frame, with the frame being subsequently painted, coated, or covered with EMF/RF shielded materials, followed by manual taping over the seams and joints with a conductive copper foil tape to create the continuous conductive layer required for a Faraday cage EMF/RF shielded enclosure. Suitable shielding inks or paints are sold under the brand names YShield EMR-Protection, Woremore, Super Shield, and Geovital. Suitable fabric sheets are sold under the Ripstop Silver Fabric brand.

These current construction methods are both labor- and time-intensive. For example, it typically takes 6 to 8 hours to construct a small display show enclosure, and various skilled workers are required (carpenters, electricians, painters etc.). In addition, due to the construct-on-site nature of the enclosures, the effectiveness of the shielding is not optimized, there typically being areas, particularly at joints between members, that are not properly shielded.

It is an object of this invention to provide a modular EMF/RF shielded enclosure that is easily and quickly assembled and disassembled, and which eliminates steps and materials utilized in current systems to reduce labor costs. It is a further object to provide such an enclosure where construction time is significantly reduced to as much as a third or a quarter of the time required using standard construction techniques. It is a further object to provide such an enclosure constructed by assembling pre-fabricated modular panel members which are each already fully EMF/RF shielded across their perimeters, wherein the panel members are rapidly connected to and disconnected from each other by rapid-disconnect compressive connector members, the connector members being electrically conductive such that electrical conductivity between adjoining panel members is accomplished through the connector members.

SUMMARY OF THE INVENTION

The invention in various embodiments comprises in general a modular electromagnetic frequency/radio frequency (EMF/RF) shielded enclosure having interconnected walls and ceiling, and floor if needed, such that passage of EMF/RF from or into the enclosure is blocked or reduced. The walls, floor and ceiling are each composed of one or more pre-fabricated panel members, each panel member comprising at least a layer of an EMF/RF shielded material, preferably an EMF/RF shielded paint, and possibly additional layers of EMF/RF shielded paint or fabric. The panel members are preferably composed of a strong yet lightweight frame or frame assembly, composed for example of wood board members, with skin members disposed on opposite sides of the frame, the skin members being thin wooden sheets or the like. The EMF/RF shielded material is disposed on all interior surfaces of the panel member.

The panel members are temporarily connected to each other by releasable, quick-connect, quick-release, compressive panel connector members, such as for example metal cam lock style or S-hook style panel connector members, which are electrically conductive. The panel connector members are preferably coated with the EMF/RF shielded material in a manner such that each is conductively connected to the interior EMF/RF shielded material covering the full interior of the panel member. The panel connector members are also preferably hard-wired to the interior EMF/RF shielded material to form an auxiliary conductive route. One or more grounding conduits, depending on the square footage of the enclosure, are connected between external grounding sources and the interior EMF/RF shielded material and/or the conductive panel connector members. In this manner both internally transmitted and externally transmitted EMF/RF is captured, conducted and dissipated through the external grounding sources by the modular EMF/RF shielded enclosure.

In alternative language, the invention is a modular EMF/RF shielded enclosure comprising interconnected panel members forming walls and a ceiling; said panel members comprising frame members, skin members attached to said frame members, EMF/RF shielding material, and quick-connect, quick-release, compressive, electrically-conductive, connector assemblies; said EMF/RF shielding material being coextensively applied to the interior surfaces of said frame members and said skin members and applied to said connector assemblies, such that said frame members, said skin members and said connector assemblies are conductively connected to each other and such that each said panel member attenuates EMF/RF; each of said connector assemblies comprising a latching body and a receiver body, and wherein for a given connector assembly said latching body is disposed in a first panel member and said receiver body is disposed in a second panel member at corresponding locations whereby with said first and second panel members in adjacent juxtaposition, said first and second panel members are compressed together by actuation of said connector assemblies, such that said connector assemblies electrically connect said first and second panel members; and a grounding member connected to at least one of said connector assemblies or to said EMF/RF shielding material. Further, such invention further comprising auxiliary conductor members connecting one or more of said connector assemblies to said EMF/RF shielding material; wherein said connector assemblies comprise cam locks carrying the common ground between said panel members; wherein said latching body of each connector assembly comprises a cam latch mounted on an axle and having a cam ridge surface, and wherein said receiver body of each connector assembly comprises catch members to receive said cam ridge surface; wherein said latching body of each connector assembly further comprises an actuator port adapted to receive a driving tool to rotate said cam latch, said actuator ports being accessible through openings in said skin members; wherein said EMF/RF shielding material is disposed on three sides of each frame member; wherein said panel members further form a floor; and/or wherein said modular EMF/RF shielded enclosure creates an attenuation level of approximately −45 dB.

DETAILED DESCRIPTION OF THE INVENTION

In general, the invention in various embodiments comprises a modular Electromagnetic Frequency/Radio Frequency (EMF/RF) shielded, multi-sided enclosure 100 having interconnected wall and ceiling panel members 10, and possibly floor panel members 10, such that passage of EMF/RF waves from outside the enclosure 100 or into the enclosure 100 is blocked or significantly reduced. The EMF/RF shielded enclosures 100 inhibit or block high-frequency electromagnetic fields and low frequency electric fields, such as fields emanating from cell phone towers, television and radio broadcasting antennas, radar, digital standard cordless telephones, wireless networks or power supply lines, to an attenuation level of approximately −45 dB. In this manner the interior of the enclosure 100 is an isolated zone not adversely affected by the external EMF/RF.

Figure 1:
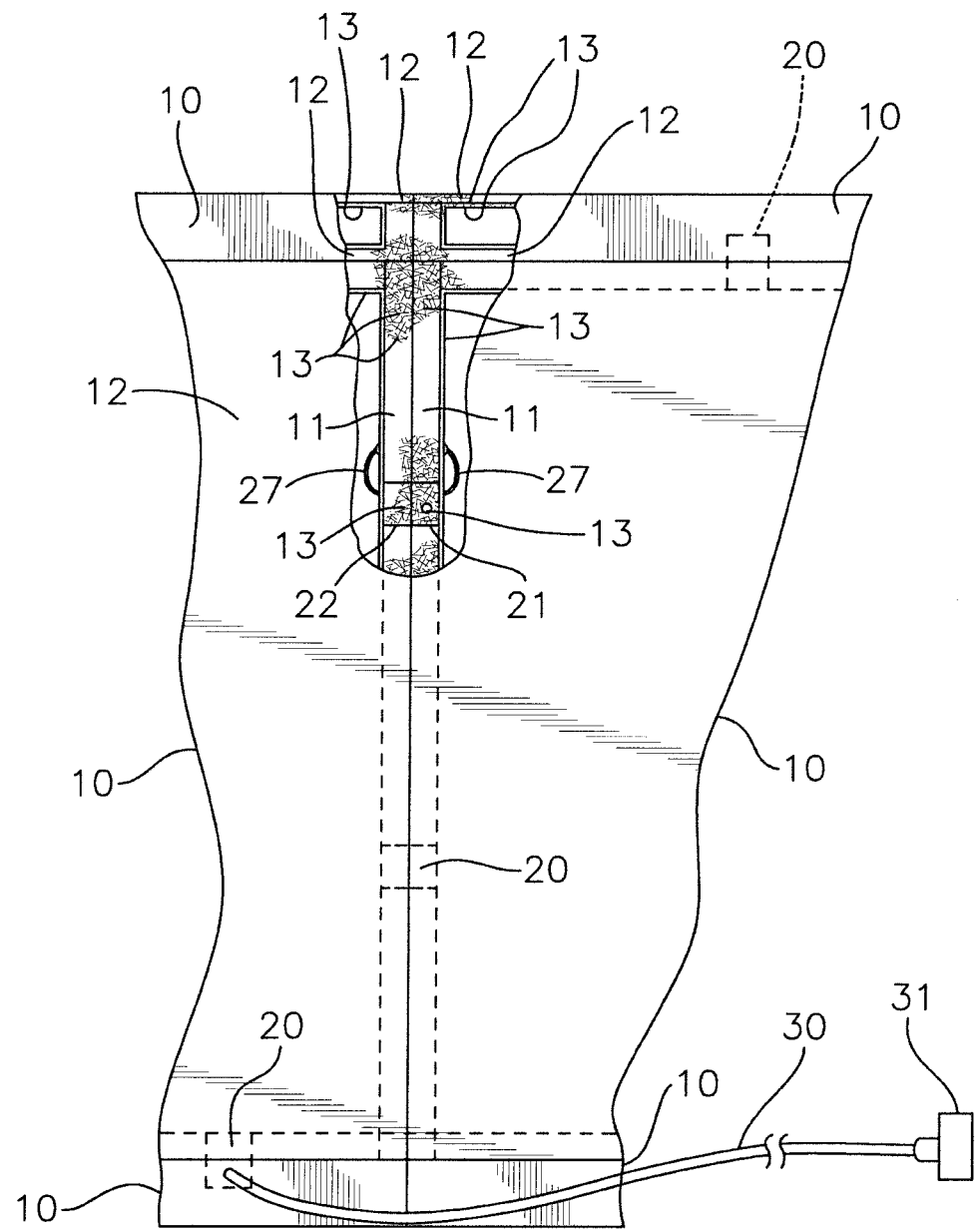
FIG. 1 is partially exposed sectional view of a representative modular EMF/RF shielded enclosure showing two wall panels, a ceiling panel and a floor panel.
Figure 2:
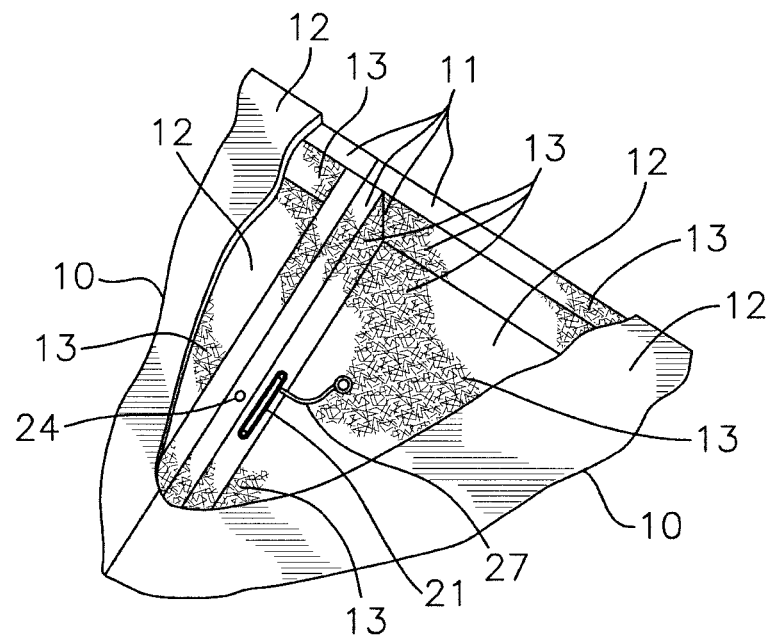
FIG. 2 is a partially exposed sectional view of an alternative embodiment of a representative modular EMF/RF shielded enclosure showing two wall panels.

The walls, floor and ceiling of the enclosures 100 are each composed of one or more panel members 10, which are sized for manual assembly and disassembly, as shown in FIGS. 1 and 2. The panel members 10 define a recti-linear external perimeter. For example, panel members 10 may be rectangular members having dimensions of 3×8 feet, 3×10 feet, etc., or square members having dimensions of 3×3 feet, 5×5 feet, etc. The panel members 10 are preferably composed of supportive frame members 11, composed for example of metal or wood members, and skin members 12 disposed on opposite sides of the frame members 11, the skin members 12 being extended in two dimensions (e.g., length and height for a vertically oriented panel member 10) yet relatively thin in the third, cross-sectional, dimension (e.g., thickness), and may be composed of thin wooden sheets or the like. Other sheet materials such as decorative laminates or materials may be used in addition to or in place of the wooden sheets forming the skin members 12.

Each panel member 10 comprises at least one layer of electrically conductive shielding material 13, preferably a shielding paint, and possibly an added layer of shielding fabric. Suitable shielding paints are sold under the brand names YShield EMR-Protection, Woremore, Super Shield, and Geovital. Multiple layers of shielding material 13 may be applied to increase the EMF/RF attenuation effectiveness. At least one but preferably both interior surfaces of the panel skin members 112 in a given panel member 10 are completely coated with the EMF/RF shielded material 13 prior to assembling each panel member 10. Likewise interior surfaces of the frame members 11 are also completely coated with the EMF/RF shielded material 13 prior to assembling each panel member 10.

In this manner, the shielding material 13 of each panel member 10 presents a fully co-extensive and complete EMF/RF shielded barrier to EMF/RF waves emanating from any direction, such that passage of EMF/RF waves through each panel member 10 is precluded or significantly restricted. The extent of the shielding is co-extensive over the full perimeter defined by the panel member 10. The shielding material 13 on the frame members 11 contacts the shielding material on the skin members 12 such that each panel member 10 is capable of performing as a Faraday cage, i.e., all shielded surfaces are electrically connected.

Figures 3A, 3B:
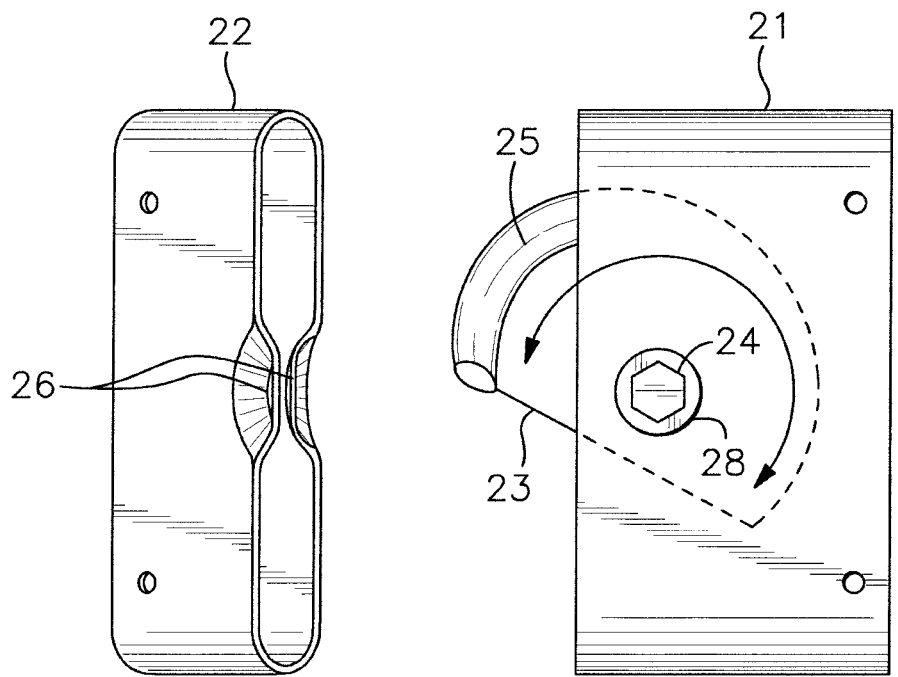
FIGS. 3A and 3B illustrate the receiver body and latching body, respectively, of a representative quick-release, compressive, connector assembly utilized to electrically connect adjoining panel members.

To form an enclosure 100, the panel members 10 are temporarily connected to each other by quick-connect, quick-release, electrically conductive, compressive, panel connector assemblies 20, preferably cam lock style panel connectors (FIGS. 3A/B and 4A/B) or S-hook type (not shown), which are composed of an electrically conductive material. The terms "quick-connect, quick-release, electrically conductive, compressive, panel connector assemblies" as used herein expressly exclude basic mechanical fasteners such as nails or screws. Cam lock style connectors are necessary in order to tightly abut adjacent panel members 10 to provide seamless bonding between the panel members 10. The panel connector assemblies 20 each comprise a pair of mating units—a latching body 21 and a receiver body 22, such that one mating unit 21/22 will be disposed in one panel member 10 and the corresponding mating unit 21/22 will be disposed in a second panel member 10 that is to be connected to the first panel member 10. When connected, the latching bodies 21 and receiver bodies 22 are in electrical communication, such that they act as a common bond or ground carrying the ground between adjacent panel members 10. The locations of the connector assemblies 20 are standardized for every panel member 10 such that assembly is readily accomplished. In this manner the entire enclosure is a Faraday cage.

Figure 4A:
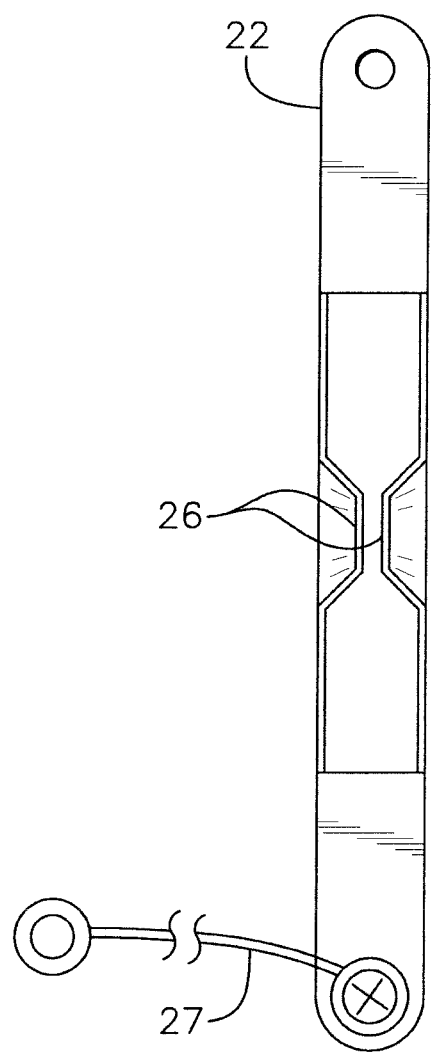
FIGS. 4A and 4B illustrate the receiver body and latching body, respectively, of an alternative embodiment of a representative quick-release, compressive, connector assembly utilized to electrically connect adjoining panel members.
Figure 4B:
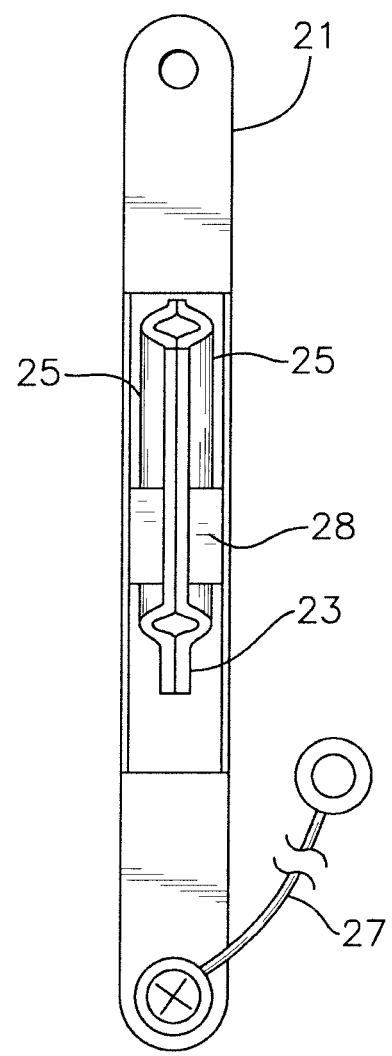

The connector assemblies 20 may be of a side-mount type (FIGS. 3A/B) or an interior-mount type (FIGS. 4A/B). The latching bodies 21 comprise a cam latch 23 disposed on an axle 28 actuatable by insertion of a driving tool into an actuator port 24. The receiver bodies 22 comprise catch members 26 configured to retain the cam ridge surface 25 of the cam latch 23. With this structure, two panel members 10 (wall-wall, wall-ceiling, wall-floor, ceiling-ceiling, floor-floor) are abutted and the cam latch 23 is manually rotated such that the cam ridge surface 25 passes behind the catch members 26, immediately and forcefully drawing the two panel members 10 into tight abutment.

The actuator ports 24 of the panel connector members 20 may be accessed with driving tools through access openings in the panel members 10, the openings being subsequently plugged or covered with matching material or similar members, or assembly of the enclosure 100 may be performed prior to final affixation of the skin members 12 to the frame members 11 on site, with the skin members 12 removed to disassemble.

To create the continuous shielding surface over the entire enclosure 100 required for reduction or elimination of EMF/RF transmissions through the enclosure 100, it is necessary that the panel connector assemblies 20 be in conductive contact with the shielding material 13 in each of the adjoining panel members 10. In one embodiment, the shielding material is applied onto the exteriors of the panel connecting members 20 and extending across the junctions between the panel connecting members 20 and the shielding material 13 disposed on the frame members 11 and/or the skin members 12. The panel connector members 20 may also be hard-wired directly to the shielding material 13 using an auxiliary conductor member 27.

Figure 5:
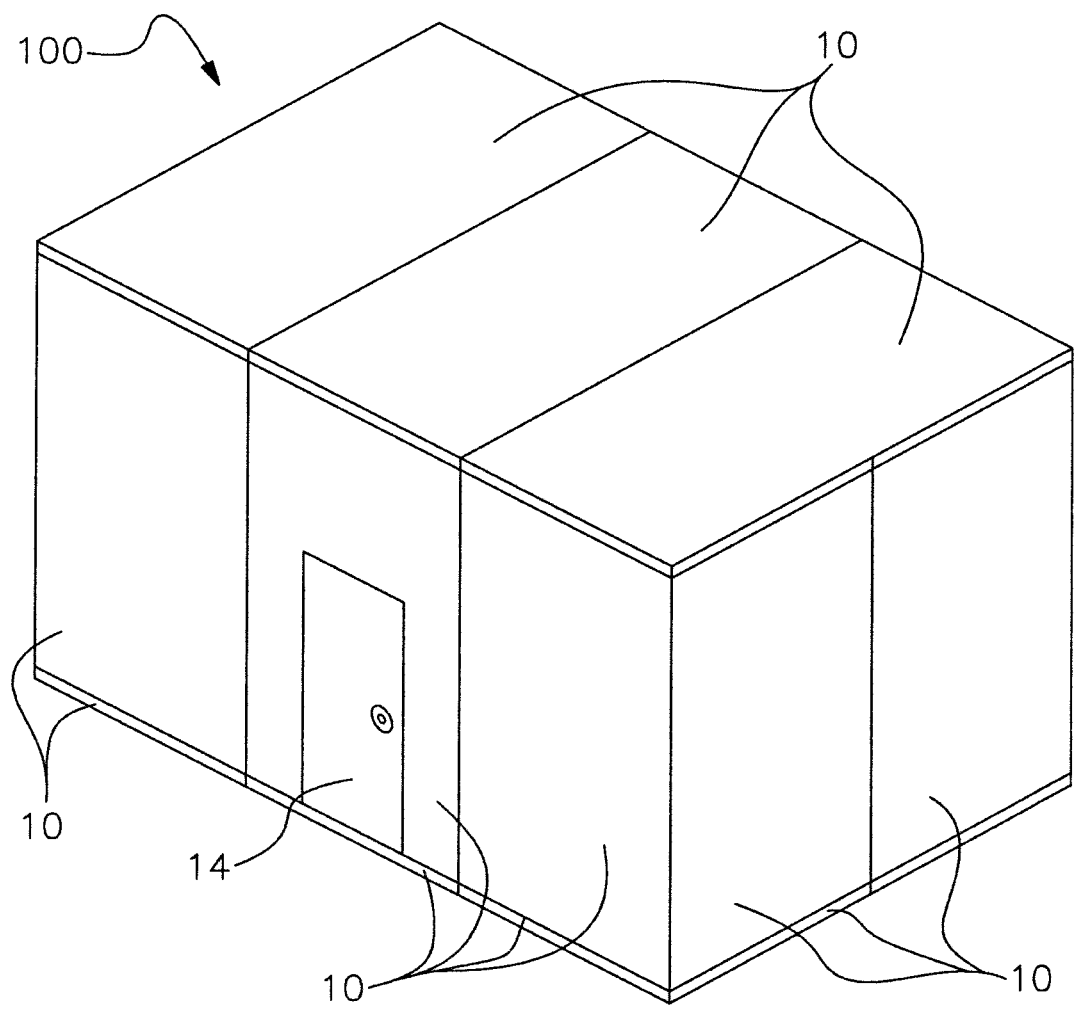
FIG. 5 is an illustration of a representative embodiment of a modular EMF/RF shielded enclosure.

In this manner, once the enclosure 100 is fully assembled with a floor, ceiling and walls, as shown in FIG. 5, a continuous conductive envelope or bonding circuit is created, as each adjacent panel member 10 is conductively joined to each adjacent panel member 10 through the conductive panel connector members 20. Door members 14 are provided in known manner such that the integrity of the Faraday cage enclosure 100 is maintained. In certain installations, such as where the enclosure 100 is to be constructed on a concrete slab or floor of certain minimum thickness and having with rebar reinforcement, it will not be necessary to create a floor out of panel members 10.

It is necessary to provide one or more grounding members 30, depending on the square footage of the enclosure 100, to relieve static charge build-up. The grounding members 30 are connected between grounding sources 31 and the shielding material 13 and/or some of the conductive panel connector assemblies 20. For example, the grounding member 30 may comprise a conductive insulated cord connected to a standard 3-prong plug wherein only the ground post is active, with the plug then inserted into a standard electrical outlet as the grounding source 31.

As previously mentioned, the effectiveness of the shielding may be increased or decreased as required for a given situation. Typical applications may be for cleaning WiFi noise and co-channel interference. Cellular signals require effective shielding in the 700 Mhz to 1.9 GhZ range, while WiFi shielding occurs in the 2.4 to 5 GhZ range. Other situations may require 802.11 AD in the 60 GhZ range, as well as VLF frequencies to block listening devices.

It is understood that substitutions and equivalents for certain elements and structures set forth above may be obvious to those of skill in the art, and therefore the true scope and definition of the invention is to be as set forth in the following claims.

I claim:

1. A modular EMF/RF shielded enclosure comprising interconnected panel members forming walls and a ceiling;
    said panel members comprising frame members, skin members attached to said frame members, EMF/RF shielding material, and quick-connect, quick-release, compressive, electrically-conductive, connector assemblies;
    said EMF/RF shielding material being coextensively applied to the interior surfaces of said frame members and said skin members and applied to said connector assemblies, such that said frame members, said skin members and said connector assemblies are conductively connected to each other and such that each said panel member attenuates EMF/RF;
    each of said connector assemblies comprising a latching body and a receiver body, and wherein for a given connector assembly said latching body is disposed in a first panel member and said receiver body is disposed in a second panel member at corresponding locations whereby with said first and second panel members in adjacent juxtaposition, said first and second panel members are compressed together by actuation of said connector assemblies, such that said connector assemblies electrically connect said first and second panel members; and
    a grounding member connected to at least one of said connector assemblies or to said EMF/RF shielding material.

2. The modular EMF/RF shielded enclosure of claim 1, further comprising auxiliary conductor members connecting one or more of said connector assemblies to said EMF/RF shielding material.

3. The modular EMF/RF shielded enclosure of claim 1, wherein said connector assemblies comprise cam locks carrying the common ground between said panel members.

4. The modular EMF/RF shielded enclosure of claim 3, wherein said latching body of each connector assembly comprises a cam latch mounted on an axle and having a cam ridge surface, and wherein said receiver body of each connector assembly comprises catch members to receive said cam ridge surface.

5. The modular EMF/RF shielded enclosure of claim 4, wherein said latching body of each connector assembly further comprises an actuator port adapted to receive a driving tool to rotate said cam latch, said actuator ports being accessible through openings in said skin members.

6. The modular EMF/RF shielded enclosure of claim 1, wherein said EMF/RF shielding material is disposed on three sides of each frame member.

7. The modular EMF/RF shielded enclosure of claim 1, wherein said panel members further form a floor.

8. The modular EMF/RF shielded enclosure of claim 1, wherein said modular EMF/RF shielded enclosure creates an attenuation level of approximately −45 dB.

9. The modular EMF/RF shielded enclosure of claim 1, wherein said modular EMF/RF shielded enclosure is a Faraday cage.

10. A modular EMF/RF shielded enclosure comprising interconnected panel members forming walls and a ceiling;
    said panel members comprising frame members, skin members attached to said frame members, EMF/RF shielding material, and quick-connect, quick-release, compressive, electrically-conductive, connector assemblies;
    each of said connector assemblies comprising a cam lock having a latching body and a receiver body, and wherein for a given connector assembly said latching body is disposed in a first panel member and said receiver body is disposed in a second panel member at corresponding locations whereby with said first and second panel members in adjacent juxtaposition, said first and second panel members are compressed together by actuation of said connector assemblies, such that said connector assemblies electrically connect said first and second panel members;

each said latching body of each connector assembly comprising a cam latch mounted on an axle and having a cam ridge surface, and an actuator port adapted to receive a driving tool to rotate said cam latch, said actuator ports being accessible through openings in said skin members, and wherein each said receiver body of each connector assembly comprises catch members to receive said cam ridge surface;

said EMF/RF shielding material coextensively applied to the interior surfaces of said frame members and said skin members and applied to said connector assemblies, such that said frame members, said skin members and said connector assemblies are conductively connected to each other and such that each said panel member attenuates EMF/RF; and a grounding member connected to at least one of said connector assemblies or to said EMF/RF shielding material;

wherein said modular EMF/RF shielded enclosure creates an attenuation level of approximately 45 dB.

11. The modular EMF/RF shielded enclosure of claim 10, wherein said panel members further form a floor.

12. The modular EMF/RF shielded enclosure of claim 10, wherein said EMF/RF shielding material is disposed on three sides of each frame member.

13. The modular EMF/RF shielded enclosure of claim 10, wherein said modular EMF/RF shielded enclosure is a Faraday cage.

* * * * *